United States Patent
Yamauchi

(10) Patent No.: US 8,598,597 B2
(45) Date of Patent: Dec. 3, 2013

(54) SEMICONDUCTOR DEVICE AND METHOD OF MANUFACTURING SEMICONDUCTOR DEVICE

(75) Inventor: Kiyoshi Yamauchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 1160 days.

(21) Appl. No.: 11/585,773

(22) Filed: Oct. 25, 2006

(65) Prior Publication Data

US 2007/0096137 A1 May 3, 2007

(30) Foreign Application Priority Data

Nov. 2, 2005 (JP) .............................. P2005-319097

(51) Int. Cl.
*H01L 33/00* (2010.01)
(52) U.S. Cl.
USPC .. 257/79; 257/99; 257/E33.058; 257/E33.075
(58) Field of Classification Search
USPC ....... 257/706–708, 79, 99, E33.058, E33.075
See application file for complete search history.

(56) References Cited

U.S. PATENT DOCUMENTS

| | | | |
|---|---|---|---|
| 7,518,155 B2 * | 4/2009 | Ishidu et al. | 257/98 |
| 7,579,629 B2 * | 8/2009 | Inoguchi | 257/98 |
| 2002/0185759 A1 * | 12/2002 | Gorczyca et al. | 264/1.33 |
| 2003/0123499 A1 * | 7/2003 | Ohgiyama et al. | 372/36 |
| 2004/0259320 A1 * | 12/2004 | Holscher et al. | 438/401 |
| 2006/0043611 A1 * | 3/2006 | Kinsman | 257/784 |

FOREIGN PATENT DOCUMENTS

| | | |
|---|---|---|
| JP | 09-289274 | 11/1997 |
| JP | 2004-172187 | 6/2004 |
| JP | 2004-207639 | 7/2004 |
| JP | 2005-203487 | 7/2005 |

OTHER PUBLICATIONS

Japanese Office Action issued Sep. 2, 2008 for corresponding Japanese Application No. 2005-319097.

* cited by examiner

*Primary Examiner* — S. V. Clark
*Assistant Examiner* — Krista Soderholm
(74) *Attorney, Agent, or Firm* — Rader, Fishman & Grauer PLLC

(57) ABSTRACT

A semiconductor device includes: a semiconductor element; a wiring board including a connection terminal to be electrically connected to the semiconductor element; and a metal plate disposed between the semiconductor element and the wiring board; wherein the metal plate is provided with an opening for exposing the connection terminal to the semiconductor element.

17 Claims, 4 Drawing Sheets

SEMICONDUCTOR DEVICE AND METHOD OF MANUFACTURING SEMICONDUCTOR DEVICE

CROSS REFERENCES TO RELATED APPLICATIONS

The present invention contains subject matter related to Japanese Patent Application JP 2005-319097 filed in the Japan Patent Office on Nov. 2, 2005, the entire contents of which being incorporated herein by reference.

BACKGROUND OF THE INVENTION

1. Field of the Invention

The present invention relates to a semiconductor device configured to be provided with a semiconductor element and a method of manufacturing the semiconductor device.

2. Related Art

In recent years, a semiconductor laser device has been known widely as a semiconductor device. The semiconductor laser device is used for, for example, an optical pickup of a disk drive device, and it is specifically configured to have a semiconductor laser element 21 for emitting a laser beam mounted on a tabular base body 22, as shown in FIGS. 4A and 4B.

In such a semiconductor laser device, heat generation caused by the semiconductor laser element 21 emitting the laser beam might have a negative effect on the reliability of the behavior. In particular, in those compliant to an increasing high-power requirement in recent years, the heating values are large, and accordingly the heat effects become significant. Therefore, some semiconductors have the base body 22 formed of a metal material having a high heat conductivity, thereby ensuring a preferable heat radiation property when the semiconductor laser element 21 emits the laser beam (see, for example, JP-A-2004-207639). Further, regarding the semiconductor laser device, it is also proposed to form the base body 22 with a ceramic material (see the above document).

SUMMARY OF THE INVENTION

Incidentally, high versatility is required for the semiconductor laser device because its availability is spreading. Specifically, the electrical connection with the semiconductor laser element 21 is required to cope with various forms of connection, namely, to be able to correspond to the switching of wiring for taking out the signals therefrom, for example, without making any changes to the inner structure of the semiconductor laser device.

In this regard, in the case in which the base body 22 is to be formed of a ceramic material, for example, a ceramic multilayer wiring board can be used so that the freedom of electrical connection with the semiconductor laser element 21 can be ensured preferably. The ceramic multilayer wiring board is a board formed of a number of single layer ceramic wiring boards stacked on one another, namely, formed of a layered body of a number of wiring layers. This is because, when using such a ceramic multilayer wiring board as the base body 22, by previously forming the layers so as to be able to respectively correspond to a number of wiring patterns utilizing the number of wiring layers, flexibly coping with switching the wiring for taking out the signals, for example, can be realized easily.

However, if the ceramic multilayer wiring board is used as the base body 22, such a preferable heat radiation property, as in the case of using a metal material with a high heat conductivity, cannot be expected. On the other hand, if the base body 22 is formed of a metal material, it becomes difficult to ensure such high versatility with respect to the form of electrical connection as in the case of using the ceramic multilayer wiring board.

Therefore, it is desired to provide a semiconductor device capable of achieving high versatility with respect to an electrical connection while ensuring a preferable heat radiation property to prevent an adverse effect caused by heat generation, and a method of manufacturing the semiconductor device.

According to an embodiment of the invention, there is provided a semiconductor device, including a semiconductor element, a wiring board including a connection terminal to be electrically connected to the semiconductor element, and a metal plate disposed between the semiconductor element and the wiring board, wherein the metal plate is provided with an opening for exposing the connection terminal to the semiconductor element.

Since the semiconductor device of the above configuration is configured to have the wiring board, the metal plate, and the semiconductor element stacked in this order, the semiconductor element is arranged so as to be mounted on the metal plate. Accordingly, even if heat is generated in the semiconductor element, the heat is discharged through the metal plate. Further, since the metal plate is provided with an opening section and the connection terminal of the wiring board is arranged so as to be exposed to the semiconductor element side by the opening section, the semiconductor element is arranged so as to be electrically connected to the wiring board though the connection terminal. In this case, by previously forming the wiring board so as to be able to cope with a number of wiring patterns, it becomes also possible to ensure the freedom of the electrical connection with the semiconductor element preferably.

As described above, according to a semiconductor device and a method of manufacturing the semiconductor device, the semiconductor element is mounted on the metal plate, and accordingly a preferable heat radiation property can be ensured even if heat is generated in the semiconductor element, and further, heat generation that causes an adverse effect on the reliability of the behavior of the semiconductor device can be prevented. Moreover, since the semiconductor element is electrically connected to the wiring board via the connection terminal, by previously forming the wiring board so as to be able to correspond to a number of wiring patterns, it becomes possible to ensure the freedom of the electrical connection with the semiconductor element preferably. Accordingly, it becomes possible to correspond to various connection forms with respect to the electrical connection with the semiconductor element so that it can cope with the switching of wiring for taking out the signals from the semiconductor element without making any changes in the internal structure of the semiconductor device, and thus the freedom of the electrical connection with the semiconductor element can be ensured preferably to realize high versatility.

Therefore, according to the semiconductor device and the manufacturing method thereof of the present embodiment, it becomes possible to realize a high versatility with respect to the electrical connection while ensuring a preferable heat radiation property so as to prevent an adverse effect caused by heat generation.

BRIEF DESCRIPTION OF THE DRAWINGS

The invention will now be described with reference to the accompanying drawings, wherein like numbers refer to like elements.

DESCRIPTION OF THE EMBODIMENTS

A semiconductor device and a method of manufacturing a semiconductor device according to an embodiment of the invention will hereinafter be explained with reference to the accompanying drawings. It should be noted that the invention is described in the present embodiment exemplifying, as the semiconductor device, a semiconductor laser device configured so as to be provided with a semiconductor laser element.

First, a schematic configuration of the semiconductor laser device will be explained.

Figure 1:
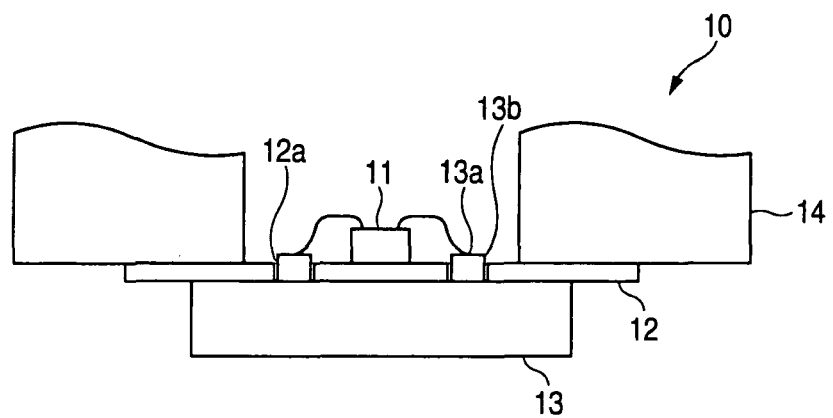
FIG. 1 is an explanatory view showing a schematic configuration example of a semiconductor laser device applying an embodiment of the invention.

FIG. 1 is an explanatory view showing a schematic configuration example of the semiconductor laser device applying an embodiment of the invention. As exemplified in the drawing, the semiconductor laser device 10 described in the present embodiment is provided with a semiconductor laser element 11, a lead frame 12 (a metal plate of the embodiment of the invention), a ceramic multilayer wiring board 13 (a wiring board of the embodiment of the invention; hereinafter simply referred to as a multilayer wiring board), and an optical pickup (hereinafter abbreviated as OP) base 14; and the device is formed by stacking these components in the order of the multilayer wiring board 13, the lead frame 12, the semiconductor laser element 11, and the OP base 14.

The semiconductor laser element 11 is composed of a publicly known semiconductor crystal element for emitting a laser beam, and accordingly, descriptions of the details of the configuration thereof will be omitted here. The semiconductor laser element 11 is mounted on the lead frame 12 by bonding using a method, such as a brazing method, and is arranged to have an electrical connection with the outside by wire bonding.

The lead frame 12 is formed of a flat plate of a metal material with high heat conductivity, such as copper, iron, or aluminum. The lead frame 12 is bonded on the multilayer wiring board 13 using, for example, a brazing method. It should be noted that an optical element or a submount (not shown) is assumed to be disposed on the lead frame 12 in association with the semiconductor laser element 11.

The multilayer wiring board 13 is a board formed of a number of single-layer ceramic wiring boards stacked on one another, namely, formed of a layered body of a number of wiring layers. Therefore, the multilayer wiring board 13 can be formed previously so that the layers thereof can respectively correspond to a number of patterns.

Further, the multilayer wiring board 13 is provided with a connection terminal group 13a, namely, a connection terminal group 13a, to be electrically connected to the semiconductor laser element 11 on the side thereof on which the lead frame 12 is stacked. By connecting the connection terminal group 13a to the semiconductor laser element 11 with wire bonding, the semiconductor laser element 11 is electrically connected to the outside via one of a number of the wiring patterns of the multilayer wiring board 13.

Further, a portion of the multilayer wiring board 13, on which the connection terminal group 13a is disposed, is formed so as to have a convex shape protruding towards the semiconductor laser element 11 side. In other words, the multilayer wiring board 13 is provided with a convex section 13b (a convex section of the embodiment of the invention) formed to have a convex shape. Further, the connection terminal group 13a is disposed on the tip portion of the convex section 13b.

In accordance with the convex section 13b of the multilayer wiring board 13, the lead frame 12 has a runout section 12a (an opening section). The runout section 12a is for exposing the connection terminal group 13a of the multilayer wiring board 13 to the semiconductor laser element side 11 so that wire bonding with the semiconductor laser element 11 can be performed. Specifically, although it can be configured by an opening or a notch provided to the lead frame 12, the planar shape thereof is not particularly limited, but can be determined as desired. This can also be applicable to the forming position of the runout section 12a, namely, the forming positions of the convex section 13b and the connection terminal group 13a of the multilayer wiring board 13, in totally the same way.

When the convex section 13b fits into the runout section 12a, the tip portion of the convex section 13b, namely, the portion on which the connection terminal group 13a is disposed, is protruded through the runout section 12a towards the semiconductor laser element 11 side. The amount of protrusion, namely, the height dimension of the convex section 13b, is not particularly limited, but can be determined considering the easiness or reliability of the wire bonding based on the height dimension of the semiconductor laser element 11. Specifically, if the height dimension of the semiconductor laser element 11 is, for example, 380 μm, a slightly smaller value of 340 μm can be adopted.

The OP base 14 is for configuring a housing of the semiconductor laser device 10. The OP base 14 is also mounted on the lead frame 12 and is bonded thereon by, for example, a brazing method or the like similarly to the case with the semiconductor laser element 11. According to the above, the OP base 14 also functions as a heat radiator for discharging the heat transferred from the semiconductor laser element 11 via the lead frame 12 in the atmosphere.

In the semiconductor laser device 10 configured as described above, since it is configured by stacking the multilayer wiring board 13, the lead frame 12, and the semiconductor laser element 11 in this order, the semiconductor laser element 11 is to be mounted on the lead frame 12. Therefore, even if heat is generated in the semiconductor laser element 11, the heat is transferred to the OP base 14 via the lead frame 12, and thus the heat is discharged to the atmosphere. In other words, it is configured so that the heat generated in the semiconductor laser element 11 can be radiated efficiently. Therefore, even if heat is generated in the semiconductor laser element 11, a preferable heat radiation property is ensured, and thus heat generation can be prevented from causing an adverse effect on the reliability of the behavior of the semiconductor laser device 10.

Moreover, in the semiconductor laser device 10 configured as described above, the lead frame 12 is provided with a runout section 12a, and it is arranged so that the connection terminal group 13a of the multilayer wiring board 13 is exposed to the semiconductor laser element 11 side by the runout section 12a, and therefore if the semiconductor laser element 11 is mounted on the lead frame 12 for making the heat radiation effective, the semiconductor laser element 11 is arranged to be electrically connected to the multilayer wiring board 13 via the connection terminal group 13a. Therefore, by previously forming the multilayer wiring board 13, which is the stacked body of a number of wiring layers, so as to be able to correspond to a number of the wiring patterns, the freedom of the electrical connection with the semiconductor laser element 11 can also be preferably ensured. Accordingly, it becomes possible to correspond to various connection forms with respect to the electrical connection with the semiconductor laser element 11 so that it can cope with the switching of wiring for taking out the signals from the semiconductor laser element 11 without making any changes in the internal structure of the semiconductor laser device 10, and thus the freedom of electrical connection with the semiconductor laser element 11 can be ensured preferably to realize high versatility. It can be considered that this works very effectively in giving freedom to the design of a flexible circuit board, the pad arrangement of the element, the layout design of the element, and so on.

Therefore, according to the semiconductor laser device 10 of the present embodiment, it becomes possible to realize high versatility with respect to the electrical connection while ensuring a preferable heat radiation property to prevent an adverse effect caused by heat generation.

A method of manufacturing the semiconductor laser device 10 configured as above will now be explained.

Figure 2A:
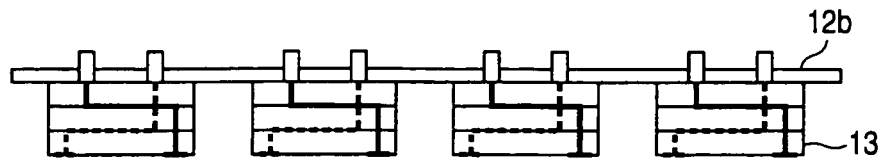
FIGS. 2A through 2C are explanatory views schematically showing an example of a method of manufacturing a semiconductor laser device applying an embodiment of the invention.
Figure 2B:
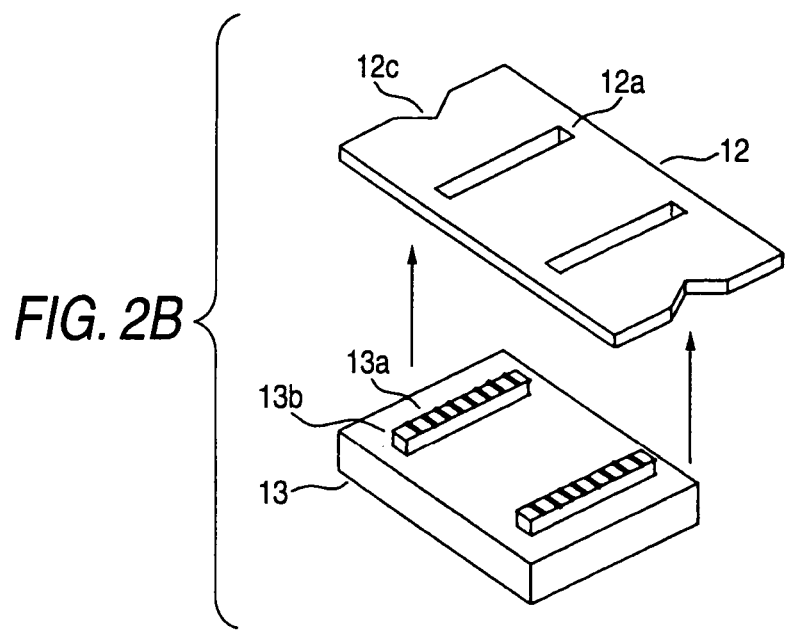
Figure 2C:
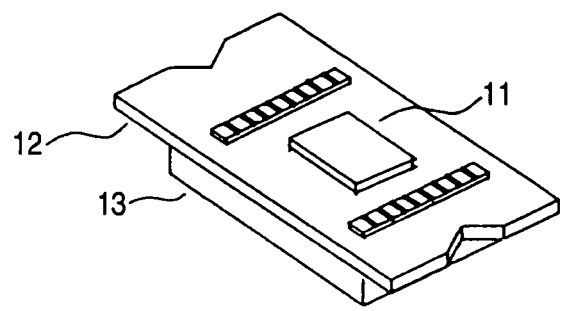

FIGS. 2A through 2C are explanatory views schematically showing an example of the method of manufacturing a semiconductor laser device applying an embodiment of the invention.

In the manufacturing method described herein, as shown in FIG. 2A, in manufacturing the semiconductor laser device 10, the lead frames 12 joined in a belt, namely, a lead frame train 12b (a metal plate train in the embodiment of the invention) for manufacturing a number of semiconductor laser devices 10, is prepared. Then, a number of multilayer wiring boards 13 are attached to one surface side (e.g., lower surface side) of the train 12b by, for example, a brazing method. It is assumed that each of the layers of the multilayer wiring board 13 is previously formed so as to be able to cope with a number of wiring patterns. Further, the multilayer wiring board 13 is assumed to be formed one size smaller than the planar shape of the lead frame 12.

The multilayer wiring board 13 is attached, as shown in FIG. 2B, while positioning the lead frame train 12b using a V-shaped groove section 12c provided to the lead frame train 12b as an alignment mark, and putting the connection terminal group 13a of the multilayer wiring board 13 towards the lead frame 12 side, so that the convex section 13b of the multilayer wiring board 13 is fitted to the runout section 12a of the lead frame 12. Thus, the tip portion of the convex section 13b, namely, the portion thereof, on which the connection terminal group 13a is disposed, protrudes from the opposite surface (e.g., the upper surface of the lead frame 12) to the surface of the lead frame 12 on which the multilayer wiring board i3 is attached. It should be noted that the shape of the groove section 12c forming the alignment mark is not limited to the V-shape but can be another shape, providing the lead frame train 12b can be positioned with the groove section 12c. Further, something in the form of a mark can be considered for use instead of the groove section 12c.

On the other hand, as shown in FIG. 2C, the semiconductor laser element 11 is attached on the opposite surface to the surface of the lead frame 12, on which the multilayer wiring board 13 is attached, using, for example, a brazing method or the like. Then, after the semiconductor laser element 11 is attached thereon, terminals (not shown) of the semiconductor laser element 11 and the connection terminal group 13a on the convex section 13b protruding towards the semiconductor laser element 11 side are connected with wire bonding, thereby ensuring the electrical connection therebetween.

In this case, the terminals of the semiconductor laser element 11 for wire bonding are typically provided on the upper surface of the semiconductor laser element 11. Therefore, if the convex section 13b of the multilayer wiring board 13 protrudes from the lead frame 12, the positions in the height direction (the stacking direction of the multilayer wiring board 13, the lead frame 12, the semiconductor laser element 11, and so on) can be prevented from differing substantially between the connection terminal group 13a disposed on the tip of the convex section 13b and the terminals of the semiconductor laser element 11. In other words, if the convex section 13b is configured to protrude towards the semiconductor laser element 11 through the runout section 12a, the length of the wire for wire bonding can be suppressed, and interference of the wire for wire bonding with other portions can also be prevented, and thus it can be expected to enhance compatibility with the wire bonding method. As a result, enhancement of efficiency, yield, and so on of the manufacturing of the semiconductor laser device 10 can be expected.

Next, the lead frame train 12b to which the semiconductor laser element 11 and the multilayer wiring board 13 are attached is cut. In this case, a cutting process is executed on the lead frame train 12b for cutting it into individual lead frames 12, thereby obtaining a number of semiconductor laser devices 10. It should be noted that the attachment of the OP base 14 is arranged so as to be performed after cutting the lead frame train 12b.

Figure 4A:
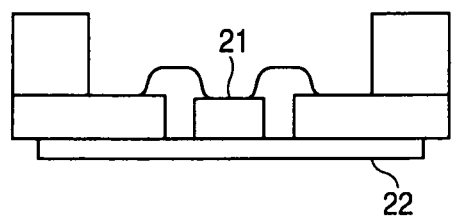
FIGS. 4A and 4B are explanatory views showing a schematic configuration example of a semiconductor laser device in the background art.
Figure 4B:
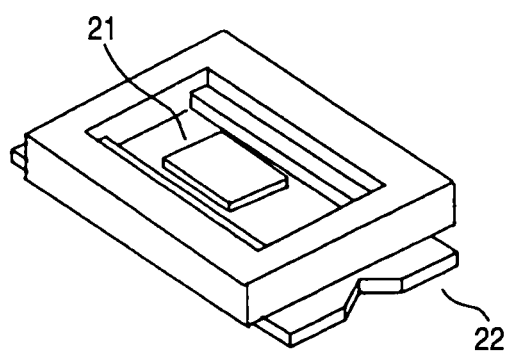

By manufacturing the semiconductor laser device 10 by using the procedure described above, it becomes possible to achieve easily the configuring of the semiconductor laser device 10 using the manufacturing device for assembling in the lead frame form, namely, the manufacturing device for the semiconductor laser device (see FIGS. 4A and 4B) having the semiconductor laser element 21 mounted on the base body 22 formed of a metal material as in the background art.

Subsequently, another embodiment of a method of manufacturing the semiconductor device 10 will be described.

Figure 3A:
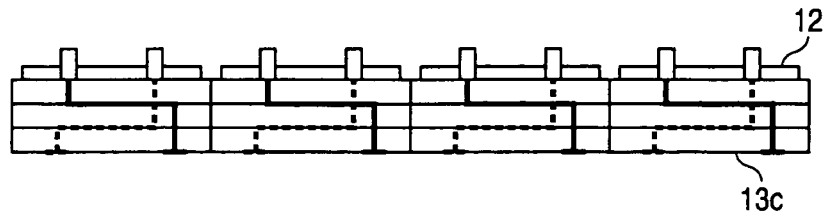
FIGS. 3A through 3C are explanatory views schematically showing another example of a method of manufacturing a semiconductor laser device applying an embodiment of the invention.
Figure 3B:
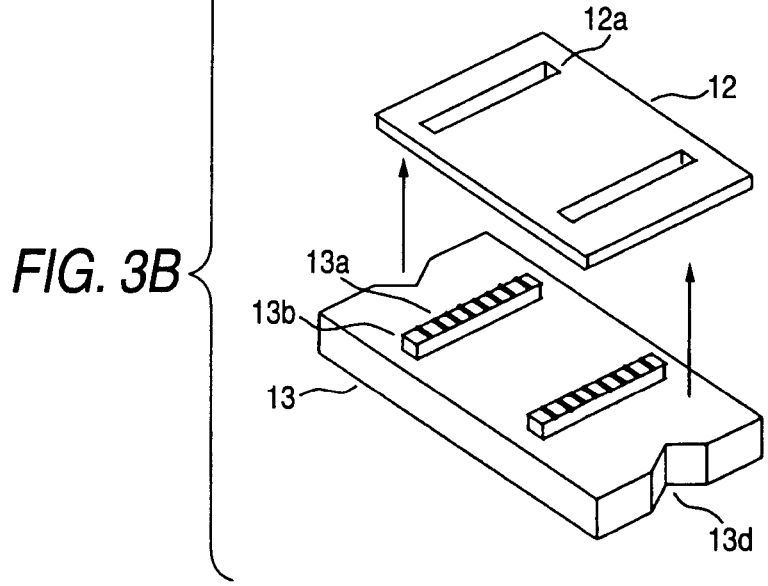
Figure 3C:
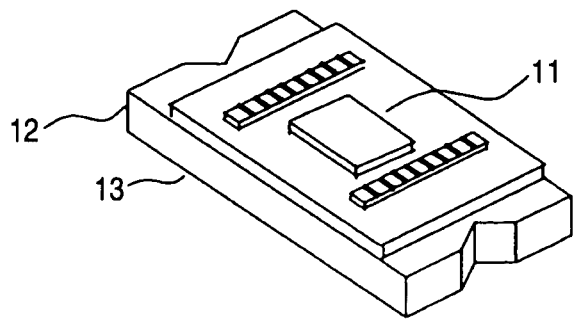

FIGS. 3A through 3C are explanatory views schematically showing another example of the method of manufacturing a semiconductor laser device applying an embodiment of the invention.

In the manufacturing method described herein, as shown in FIG. 3A, in manufacturing the semiconductor laser device 10, the multilayer wiring boards 13 joined in a belt or a matrix, namely, a multilayer wiring board train 13c (a wiring board train in the embodiment of the invention) for manufacturing a number of semiconductor laser devices 10, is prepared. It is assumed that each piece of the multilayer wiring boards 13 in the multilayer wiring board train 13c is previously formed to be able to correspond to a number of wiring patterns. Then, a number of lead frames 12 are attached to one surface side of the train 13c, specifically, the surface on which the convex section 13b and the connection terminal group 13a are disposed using, for example, a brazing method or the like. The lead frame 12 is assumed to be formed one size smaller than the planar shape of the multilayer wiring board 13.

The lead frame 12 is attached, as shown in FIG. 3B, while positioning the multilayer wiring board train 13c using a V-shaped groove section 13d provided to the multilayer wiring board train 13c as an alignment mark, so that the convex section 13b of the multilayer wiring board 13 is fitted to the runout section 12a of the lead frame 12. Thus, the tip portion of the convex section 13b, namely, the portion thereof on which the connection terminal group 13a is disposed, protrudes from the opposite surface (e.g., the upper surface of the lead frame 12) to the surface of the lead frame 12 on which the multilayer wiring board 13 is attached. It should be noted that the shape of the groove section 13d forming the alignment mark is not limited to the V-shape but can be another shape, providing the multilayer wiring board train 13c can be positioned with the groove section 13d. Further, something in the form of a mark can be considered for use instead of the groove section 13d.

On the other hand, as shown in FIG. 3C, the semiconductor laser element 11 is attached on the opposite surface to the surface of the lead frame 12, on which the multilayer wiring board 13 is attached, using, for example, a brazing method or the like. Then, after the semiconductor laser element 11 is attached thereon, terminals (not shown) of the semiconductor laser element 11 and the connection terminal group 13a on the convex section 13b protruding towards the semiconductor laser element 11 side are connected with wire bonding, thereby ensuring the electrical connection therebetween.

In this case, if the convex section 13b is configured to protrude towards the semiconductor laser element 11 through the runout section 12a, the length of the wire for wire bonding can be suppressed, and interference of the wire for wire bonding with other portions can also be prevented, and thus it can be expected to enhance compatibility with the wire bonding method. As a result, enhancement of efficiency, yield, and so on of the manufacturing of the semiconductor laser device 10 can be expected.

Next, the multilayer wiring board train 13c to which the semiconductor laser element 11 and the lead frame 12 are attached is cut. In this case, a cutting process is executed on the multilayer wiring board train 13c for cutting it into individual multilayer wiring boards 13, thereby obtaining a number of semiconductor laser devices 10. It should be noted that the attachment of the OP base 14 is arranged so as to be performed after cutting the multilayer wiring board train 13c.

By manufacturing the semiconductor laser device 10 along the procedure described above, it becomes possible to achieve easily the configuring of the semiconductor laser device 10 using the manufacturing device for assembling in the form of corrective boards, namely, the manufacturing device for the semiconductor laser device (see FIGS. 4A and 4B) having the semiconductor laser element 21 mounted on the base body 22 formed of a ceramic material as in the background art.

It should be noted that although preferable, specific practical examples of the invention are described in the present embodiments, the invention is not limited to the contents thereof. For example, although in the present embodiments the descriptions are made exemplifying the semiconductor laser device as the semiconductor device, the invention can be considered to apply to other semiconductor devices than the semiconductor laser device in completely the same manner providing the semiconductor device is configured to include a semiconductor element capable of generating heat and the electrical connection between the semiconductor device and the outside is established by wire bonding.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a semiconductor laser element in physical contact with a metal lead frame, a laser beam being emissible from said semiconductor laser element;
   a ceramic wiring board in physical contact with a connection terminal and said metal lead frame, said metal lead frame being between said ceramic wiring board and said semiconductor laser element;
   a wire bonding configured to electrically connect said semiconductor laser element with a tip portion of the connection terminal, said tip portion protruding through a runout section of the metal lead frame;
   a different ceramic wiring board in physical contact with said metal lead frame, a space being between said ceramic wiring board and said different ceramic wiring board.

2. The semiconductor device according to claim 1, wherein said runout section is an opening through the metal lead frame or a notch in the metal lead frame.

3. The semiconductor device according to claim 1, further comprising:
   an optical pickup base in physical contact with said metal lead frame, said semiconductor laser element being between a portion of the optical pickup base and another portion of the optical pickup base.

4. The semiconductor device according to claim 3, wherein said optical pickup base is capable of radiating heat away from said semiconductor laser element.

5. The semiconductor device according to claim 3, wherein said metal lead frame is between said ceramic wiring board and said optical pickup base.

6. The semiconductor device according to claim 1, wherein said metal lead frame is capable of radiating heat away from said semiconductor laser element.

7. The semiconductor device according to claim 1, wherein said ceramic wiring board has multiple ceramic layers.

8. The semiconductor device according to claim 1, further comprising:
   an alignment mark, said alignment mark being from the group consisting of a groove section within said ceramic wiring board and a groove section within said metal lead frame.

9. A semiconductor device comprising:
   a semiconductor laser element in physical contact with a metal lead frame, a laser beam being emissible from said semiconductor laser element;
   a ceramic wiring board in physical contact with a connection terminal and said metal lead frame, said metal lead frame being between said ceramic wiring board and said semiconductor laser element;
   a wire bonding configured to electrically connect said semiconductor laser element with a tip portion of the connection terminal, said tip portion protruding through a runout section of the metal lead frame;
   a different metal lead frame in physical contact with said ceramic wiring board, a space being between said metal lead frame and said different metal lead frame.

10. The semiconductor device according to claim 9, wherein said runout section is an opening through the metal lead frame or a notch in the metal lead frame.

11. The semiconductor device according to claim 9, further comprising:
    an optical pickup base in physical contact with said metal lead frame, said semiconductor laser element being between a portion of the optical pickup base and another portion of the optical pickup base.

12. The semiconductor device according to claim 11, wherein said optical pickup base is capable of radiating heat away from said semiconductor laser element.

13. The semiconductor device according to claim 11, wherein said metal lead frame is between said ceramic wiring board and said optical pickup base.

14. The semiconductor device according to claim 9, wherein said metal lead frame is capable of radiating heat away from said semiconductor laser element.

15. The semiconductor device according to claim 9, wherein said ceramic wiring board has multiple ceramic layers.

16. The semiconductor device according to claim 9, further comprising:
   an alignment mark, said alignment mark being from the group consisting of a groove section within said ceramic wiring board and a groove section within said metal lead frame.

17. The semiconductor device according to claim 9, further comprising:
   a different ceramic wiring board in physical contact with said metal lead frame, a space being between said ceramic wiring board and said different ceramic wiring board.

* * * * *